United States Patent [19]
Watanabe et al.

[11] Patent Number: 5,768,321
[45] Date of Patent: Jun. 16, 1998

[54] AUTOMATIC FREQUENCY CONTROL UNIT WHICH DETECTS A FRAME PATTERN IN A PHASE MODULATION SIGNAL

[75] Inventors: Hiroaki Watanabe, Yokohama; Tomoyuki Ueno, Kawasaki; Mitsuhiro Ono, Kawasaki; Seiichi Yamaguchi, Kawasaki, all of Japan

[73] Assignee: Fujitsu Limited, Kawasaki, Japan

[21] Appl. No.: 724,953

[22] Filed: Oct. 2, 1996

[30] Foreign Application Priority Data

Feb. 8, 1996 [JP] Japan ................... 8-022812

[51] Int. Cl.$^6$ .............. H04L 27/06; H04L 27/18; H04L 7/04
[52] U.S. Cl. ................. 375/344; 455/192.2; 375/329; 375/368; 375/362; 370/513
[58] Field of Search ................. 375/344, 326, 375/329, 362, 363, 365, 368, 327, 332, 366; 329/304, 306, 307, 310; 455/192.2, 192.1, 164.2, 164.1, 257; 370/510, 512, 513, 514, 509

[56] References Cited

U.S. PATENT DOCUMENTS 4,849,995   7/1989   Takeo et al. ................. 375/368
5,335,348   8/1994   Kono ........................ 455/192.2

OTHER PUBLICATIONS

Patent Abstracts of Japan, Jun. 1987 JP62-128236, Tagami, 'Reception Frame Synchronizing Control Sytem'; issued Jun. 10, 1987.
Patent Abstracts of Japan, Aug. 1988 JP63-204946, Ishizu, 'Demodulator'; issued Aug. 24, 1988.
Patent Abstracts of Japan, Jan. 1978 JP53-137657, Fujino, 'Phase Demodulation Unit'; issued Jan. 12, 1978.
Patent Abstracts of Japan, Oct. 1995 JP07-254888, Yoshiatsu, 'Method and Device for Discriminating Frame Synchronization'; issued Oct. 3, 1995.
Patent Abstracts of Japan, Apr. 1992 JP04-129432, Hamada, 'Aperture Gate Type Unique Word Detection System'; issued Apr. 30, 1992.
Patent Abstracts of Japan, Aug. 1994 JP06-216769, Ukita, 'PLL Circuit and Digital Demodulation Circuit Provided with the Same'; issued Aug. 5, 1994.
Patent Abstracts of Japan, Aug. 1994 JP06-232928, Furukawa, 'Clock Recovery Circuit for Demodulator'; issued Aug. 19, 1994.

*Primary Examiner*—Stephen Chin
*Assistant Examiner*—Betsy L. Deppe
*Attorney, Agent, or Firm*—Staas & Halsey

[57] ABSTRACT

An automatic frequency controller synchronizes a received carrier signal with a simulated carrier signal to automatically control a center frequency of the simulated carrier signal. The received carrier signal has a first synchronous code pattern inserted into a plurality of frame periods and a second synchronous code pattern inserted into a plurality of multiframe periods. The phase of the received carrier signal is determined by sweeping the center frequency of the simulated carrier signal and mixing the simulated carrier signal with the received carrier signal. The sweep of the center frequency of the simulated carrier signal is reduced when frame synchronization is detected and the sweep of the center frequency is fixed when multiframe synchronization is detected.

20 Claims, 9 Drawing Sheets

AUTOMATIC FREQUENCY CONTROL UNIT WHICH DETECTS A FRAME PATTERN IN A PHASE MODULATION SIGNAL

BACKGROUND OF THE INVENTION

1. Field of the Invention

The present invention relates to satellite multimedia multiple addressing systems for one-way simultaneous transmission of various pieces of an information signal from a transmitting station to a receiving station through a communication satellite. More particularly, the present invention relates to an automatic frequency control circuit which is mounted on a card within a personal computer and which receives a digital phase-modulated signal as part of a satellite multimedia multiple addressing system.

2. Description of the Related Art

Three types of automatic frequency control circuits having three respective scanning control methods have been proposed for receiving a digital phase-modulated signal. Examples of these three automatic frequency control circuits are illustrated in FIGS. 1–4, wherein like reference numerals refer to like elements throughout.

As illustrated in FIG. 1, a first prior art structure has been proposed as an automatic frequency control circuit. As illustrated, phase detecting unit 1 detects phases of a received four-phase modulated signal with a carrier signal output from internal VCO (Voltage Control Oscillator) 11. Phase detecting unit 1 extracts phase elements Ich and Qch from the modulated signal and then outputs them to A/D converter 2. A/D converter 2 quantizes the analog phase elements Ich and Qch into 8-bit demodulated baseband signals, i.e. a demodulating baseband output, and outputs the quantized demodulation baseband signals to eye pattern integration arithmetic unit 3.

Eye pattern integration arithmetic unit 3 squares the digital phase elements Ich and Qch, differentiates and integrates these values, and provides output to comparator 4. Comparator 4 sequentially compares integrated outputs from eye pattern integration arithmetic unit 3 with a threshold value and outputs a value "1" when the integrated output is larger than the threshold value and a value "0" when the integrated output is smaller than the threshold value.

AFC sweep control unit 5 provides an output voltage after being almost set to a constant value when an output of comparator 4 is "1". AFC sweep control unit 5 provides a different output voltage after receiving an output value of "0" from comparator 4. VCO 11 of phase detecting unit 1 receives an output voltage from AFC sweep control unit 5. VCO 11 shifts the center frequency of the carrier to a large extent when a received voltage variation is large and shifts the center frequency of the carrier to a small extent when a received voltage variation is small. The amount of shift depends upon a variation of the output voltage value from the AFC sweep control unit 5. Moreover, VCO 11 fixes the center frequency of the carrier when the output voltage of the AFC sweep control unit 5 does not change. That is, the automatic frequency control circuit of FIG. 1 stops a sweeping operation upon determining that the eye pattern is fully opened. The center frequency of VCO 11 is almost matched with the transmitted signal carrier frequency when the integrated output of the eye pattern integration arithmetic unit 3 becomes lower than a predetermined value, namely the threshold value.

In the automatic frequency control circuit of prior art FIG. 1, accurate frequency control can be accomplished because judgement is made by indirectly observing a detected output. However, a noise margin or stability of a sample frequency, etc. significantly affects the demodulation characteristic. Therefore, in the automatic frequency control circuit of prior art FIG. 1, when a noise proof characteristic and frequency stability of a local oscillator is considered, an error element influenced by these factors is absorbed, synchronization can no longer be locked, and convergence is impossible. Thus, it is difficult to assure high speed sweeping with a short period of observation time.

It is probable that the automatic frequency control circuit of prior art FIG. 1 takes several seconds for a pull-in time of AFC (automatic frequency control) when the communication rate is 5 Mbps or less. Moreover, the sweep control method of prior art FIG. 1 has a problem in that synchronization cannot be established, thereby disabling demodulation.

FIG. 2 illustrates a second prior art sweep control structure of an automatic frequency control circuit. Operation of the second sweep control structure is explained below.

Phase detecting unit 1 detects phase elements of a four-phase modulated signal with a carrier signal output from VCO 11, and outputs analog detected phase elements to A/D converter 2. A/D converter 2 converts the phase-detected analog phase elements into quantized digital signals. Error correction decoder 6 applies an error correcting function to all bits of the digital signal to correct an error and thereafter outputs the signals as demodulated baseband signals. Error correction decoder 6 also outputs an error detection bit at a bit position.

Error accumulation arithmetic unit 7 outputs a value obtained by accumulating a number of detected pulses to comparator 4 as an accumulated output. Comparator 4 compares the accumulated output of error accumulation arithmetic unit 7 with a threshold value. In other words a number of error bits is accumulated within a predetermined period and compared with respect to a threshold value (for example, about $10^5$). Comparator 4 outputs a value "1" when the integrated output is larger than the threshold value and outputs a value "0" when the integrated output is smaller than the threshold value. AFC sweep control unit 5 provides an output voltage after it is set to a constant value (when the output of the comparator 4 is "1") and also provides an output voltage after it is changed (when the output of comparator 4 is "0"). VCO 11 shifts the center frequency of the generated carrier signal depending upon a change in the voltage value output from the AFC sweep control unit 5.

In the automatic frequency control circuit of second prior art FIG. 2, since an error correction code is introduced by the digital processing, an excessively long time is required for arithmetic processing. Arithmetic processing includes error correction of the error correcting decoder and integral processing for accumulation of the number of errors in the error accumulation arithmetic unit.

The automatic frequency control circuit of prior art FIG. 2 is required to have a lower sweep speed (for changing the output voltage of AFC sweep control unit 5) in order to follow the processing time required by the above error correction and error accumulation. Therefore, the automatic frequency control circuit of prior art FIG. 2 cannot realize quick synchronization locking and cannot process a high speed signal.

FIG. 3 illustrates a third prior art sweep control structure of an automatic frequency control circuit. FIG. 4 illustrates an internal structure of synchronous code detector 8 illustrated in FIG. 3. Operation of the third prior art sweep control structure will now be explained with reference to FIG. 3 and FIG. 4.

As illustrated in FIG. 3, phase detecting unit 1 detects the phase elements of a four-phase modulated signal with a carrier signal output from VCO 11. Phase detecting unit 1 outputs the detected phase elements to A/D converter 2. A/D converter 2 then converts the analog phase elements into quantized digital signals. The quantized digital signals are then input to synchronous code detector 8.

Synchronous code detector 8, as illustrated in FIG. 4, receives a quantized digital signal $D_{in}$, bit by bit, with serial-input parallel-output shift register 81, for a predetermined number of bits n, in synchronization with a system clock signal CLOCK. Parallel-output register 83 of n-bits stores a unique word pattern consisting of bit stream data which is equal to a predetermined unique word.

EX-OR unit 82 sequentially compares the latest n-bit data $d_{n-1}$ to $d_0$ (which is shift-inputted by serial-input parallel-output shift register 81 in synchronization with the clock CLOCK) and the unique word patterns $P_{n-1}$ to $P_0$ in parallel-output register 83. Next, n output bits are set to the logical "H" level when the n-bit data $d_{n-1}$ to $d_0$ are perfectly matched with the unique word patterns $P_{n-1}$ to $P_0$. Adder circuit 84 sums up the number of output bits $X_{n-1}$ to $X_0$ which become the logical "H" level.

Comparator 86 compares a threshold value which is preset in output-only register 85 with a total AX from adder circuit 84. Comparator 86 outputs a detected pulse of a logical "H" level to synchronization protection unit 9 only when the condition is satisfied. This provides a determination that a unique word pattern has been detected.

As illustrated in FIG. 3, synchronization protection unit 9 employs the rear end protecting method and outputs a frame synchronization setup flag when the number of detected pulses of the synchronous code detector 8 reaches a predetermined number. AFC sweep control unit 5 supplies a voltage having a considerably small change to VCO 11 when the frame synchronization setup flag of the synchronization protection unit 9 is set. AFC sweep control circuit 5 also applies a voltage showing a considerably large change to VCO 11 when the frame synchronization setup flag is not set. VCO 11, in phase detecting unit 1, controls a degree of shift of the center frequency of the carrier depending on the voltage value output from AFC sweep control unit 11.

The automatic frequency control circuit of prior art FIG. 3 assures locking of synchronization by AFC in the highest speed in comparison with the sweep control methods of prior art FIG. 1 and FIG. 2.

However, the automatic frequency control circuit of prior art FIG. 3 is constituted such that all phase conditions of the synchronous code detector are detected since the phase of the receiving signal by the phase deviation modulating system cannot be absolutely detected in the receiving side. For example, any one of the four phase signal points is received in the case of the four-phase modulation system.

Therefore, since the synchronous code is detected even when the signal is demodulated in any phase condition, even if a certain degree of deviation is provided between the sweep frequency (namely the center frequency of the simulated carrier from VCO) and the frequency of the transmitted signal carrier, it is impossible to reject the synchronization protecting function. Thus, there is a fear that the transmitted signal frequency is fixed by the carrier in a deviated frequency, thereby disabling reproduction of data.

Moreover, in the automatic frequency control circuit of prior art FIG. 3, a frequency difference for phase detection between the reproduced carrier and the receiving signal carrier can be lessened by monitoring the detecting condition of the synchronous code detected by the synchronous code detecting unit. However, since a detection object is only a part of the receiving signal and is divergent (short periodic), if there is a phase change between the synchronous codes in the receiving signal, it cannot be detected.

In addition, in order to avoid the condition that the center frequency of the carrier (deviated from the transmitted carrier signal frequency) is fixed in the automatic frequency control circuit of prior art FIG. 3, demodulator parameters must be adjusted. For example, if the tracking frequency range $\Delta f$ is fixed after the carrier frequency of VCO is fixed, the tracking frequency range $\Delta f$ must be extended by receiving the synchronization flag with the AFC sweep control unit. Therefore, such adjustment deteriorates the demodulation characteristic in almost all cases and does not adequately reproduce data.

SUMMARY OF THE INVENTION

It is an object of the present invention to detect synchronization by a plurality of synchronous codes and phase conditions of the synchronous code in view of a detected change of phase in the data provided between a plurality of synchronous codes included in the receiving signal.

It is a further object of the invention to synchronize a simulated carrier signal with a detected carrier signal and to detect a change of phase in the data provided between a plurality of synchronous codes included in the receiving signal.

Moreover, it is a further object of the invention to stabilized a simulated carrier quickly and to improve effeciency in carrier signal transfer.

Objects of the invention are achieved by an automatic frequency controller which synchronizes a received carrier signal with a simulated carrier signal comprising: means for receiving a carrier signal having a center frequency, wherein the received carrier signal has a first synchronous code pattern inserted into a plurality of frame periods and a second synchronous code pattern inserted into a plurality of multiframe periods; means for detecting the phase of the received carrier signal by sweeping the center frequency of a simulated carrier signal and mixing the simulated carrier signal with the received carrier signal; means for detecting frame synchronization from the first synchronous code patterns; means for detecting multiframe synchronization from the second synchronous code pattern; and means for reducing sweep of the center frequency of said simulated carrier signal when frame synchronization is detected and fixing the center frequency of said simulated carrier signal when multiframe synchronization is detected.

Further objects of the invention are achieved by an automatic frequency control circuit comprising: a receiving unit for receiving a phase-modulated signal in which a synchronous code pattern is inserted into each of a plurality of predetermined frame periods and a plurality of synchronization identification bits are inserted into each of a plurality of multiframe periods; a phase detecting unit for detecting the phase of the phase-modulated signal with a sweeping regenerated carrier signal; a synchronous code detecting unit for detecting whether the synchronous code pattern is matched with one of a plurality of predetermined synchronous code patterns; an upper frame detecting unit for detecting whether the plurality of synchronization identification bits are matched with a predetermined bit pattern; and a sweep control unit for fixing sweep of said regenerated carrier signal when matching is detected by said upper frame detecting unit and said synchronous code detecting unit.

Moreover, objects of the invention are further achieved by a sweep control unit which reduces sweeping of a center frequency of a carrier reproducing unit and also reduces frequency variation of the carrier reproducing unit when synchronization is detected by the frame synchronization detecting unit and fixes the center frequency of the carrier reproducing unit when synchronization is detected by a frame synchronization detecting unit and a multiframe synchronization detecting unit.

BRIEF DESCRIPTION OF THE DRAWINGS

These and other objects and advantages of the invention will become apparent and more readily appreciated from the following description of the preferred embodiments, taken in conjunction with the accompanying drawings of which.

DESCRIPTION OF THE PREFERRED EMBODIMENTS

Figure 1:
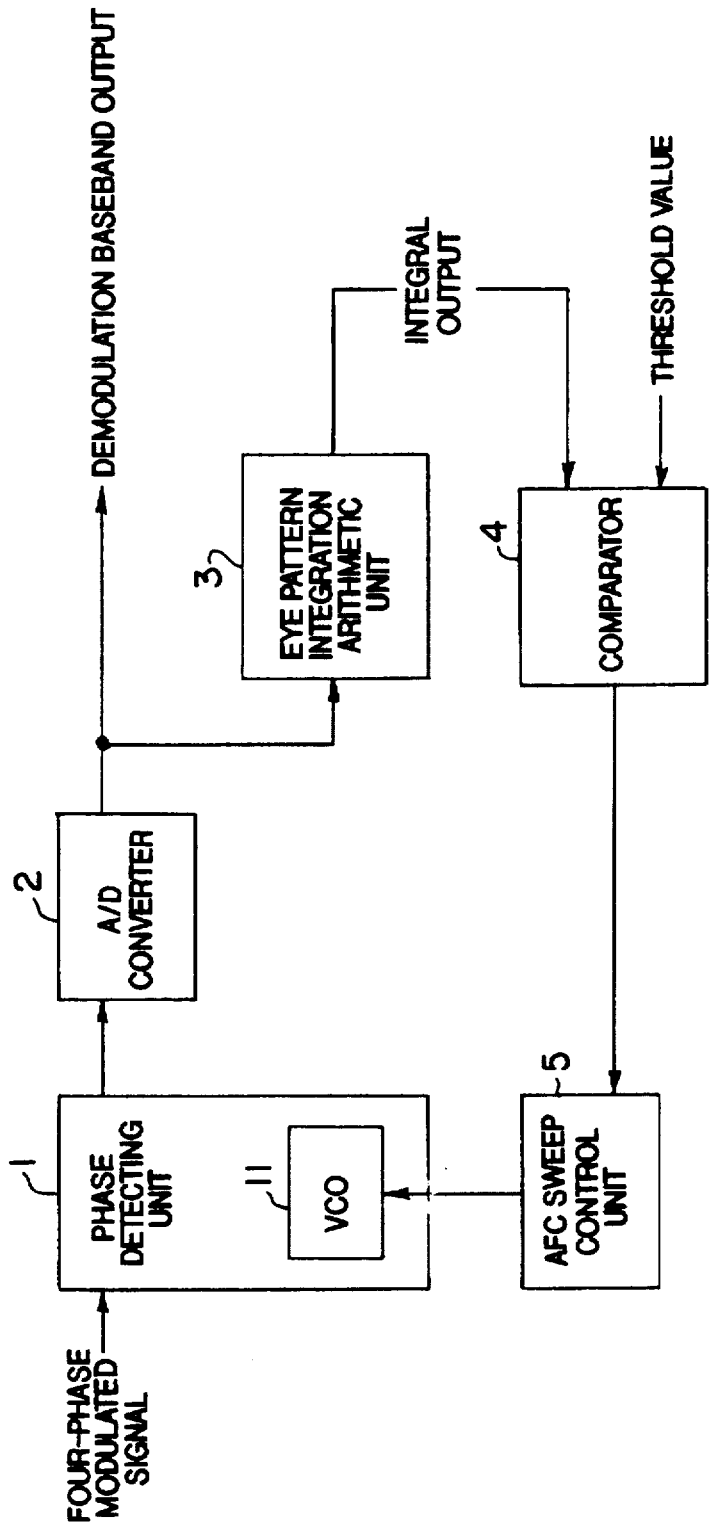
FIG. 1 illustrates a prior art sweeping control structure of an automatic frequency control circuit.
Figure 2:
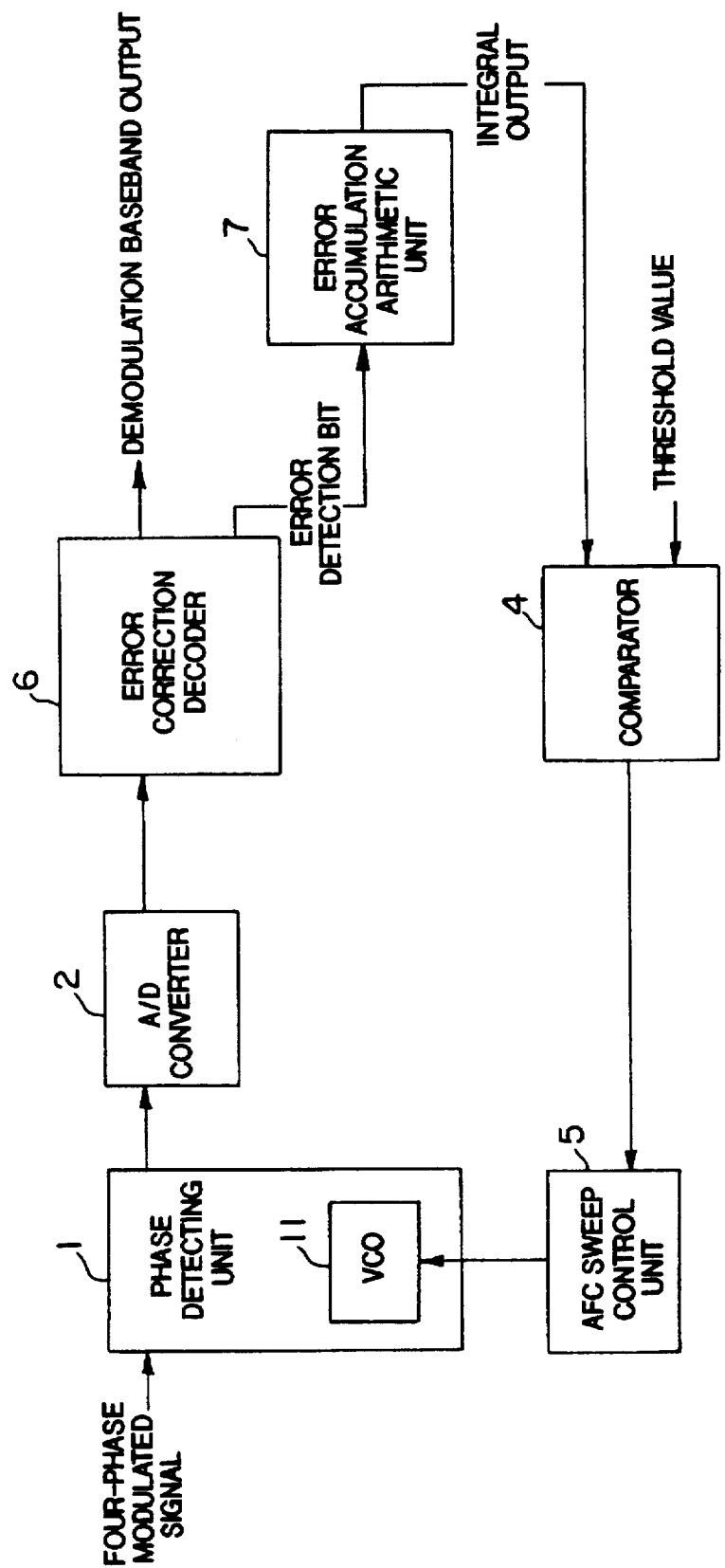
FIG. 2 illustrates a second prior art sweeping control structure of an automatic frequency control circuit.
Figure 3:
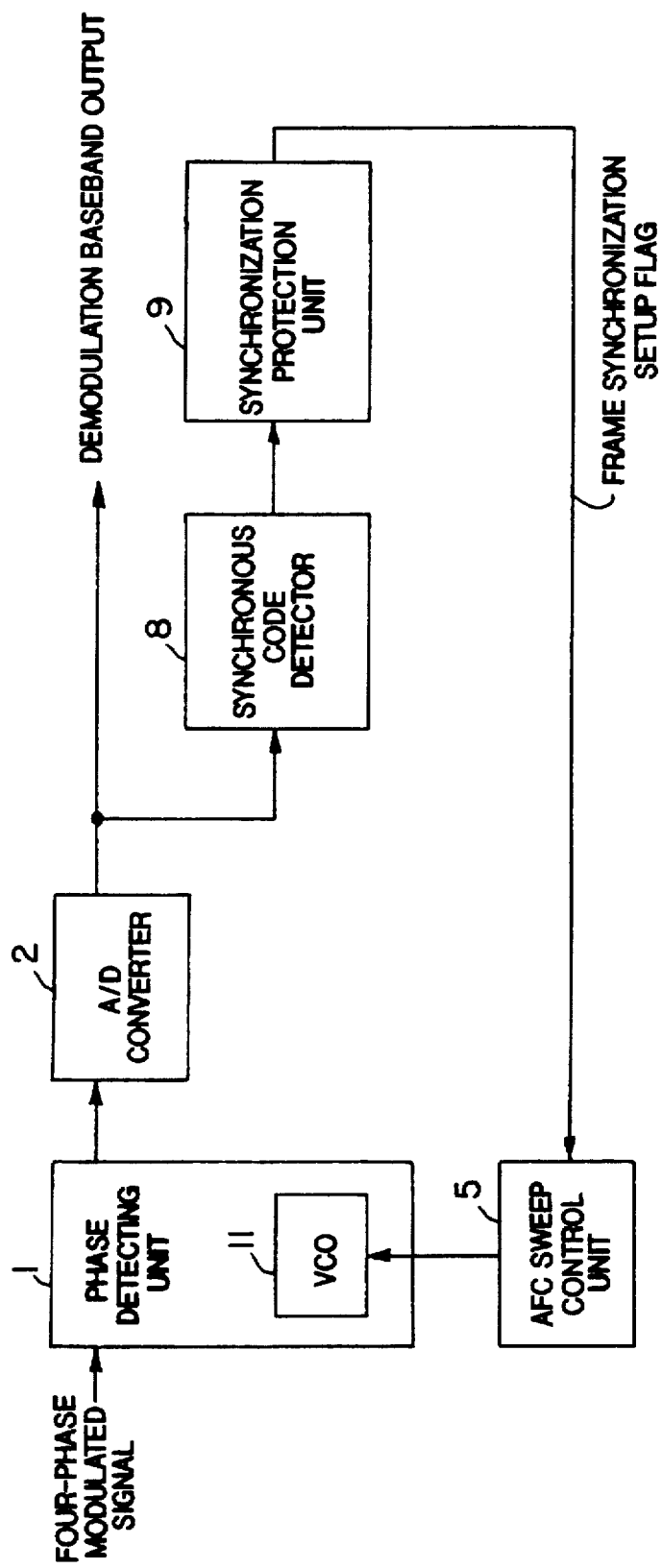
FIG. 3 illustrates a third prior art sweeping control structure of an automatic frequency control circuit.
Figure 4:
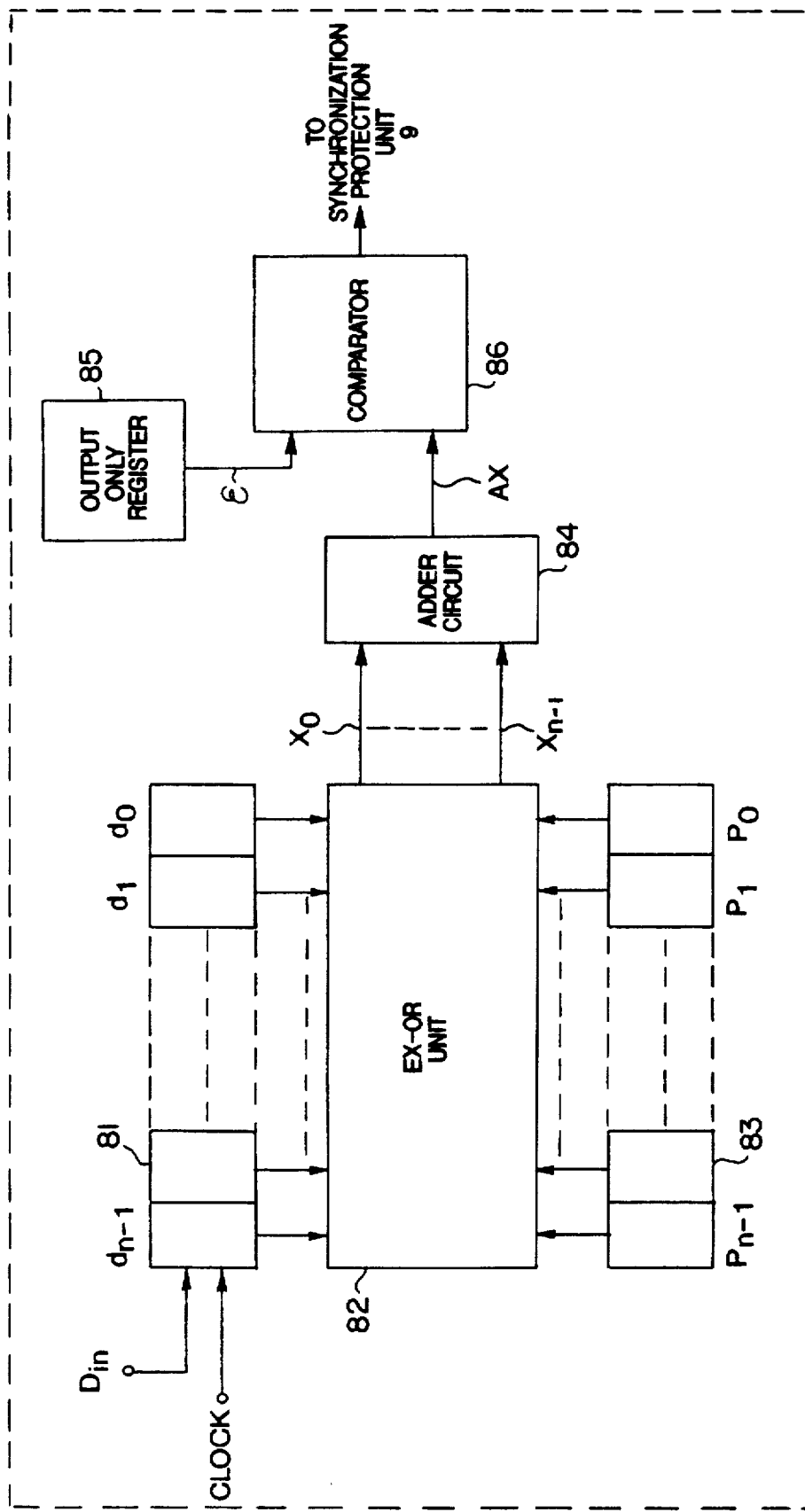
FIG. 4 illustrates a detailed prior art structure of a synchronous code detector.

Reference will now be made in detail to the present preferred embodiments of the present invention, examples of which are illustrated in the accompanying drawings, wherein like reference numerals refer to like elements throughout.

Figure 5:
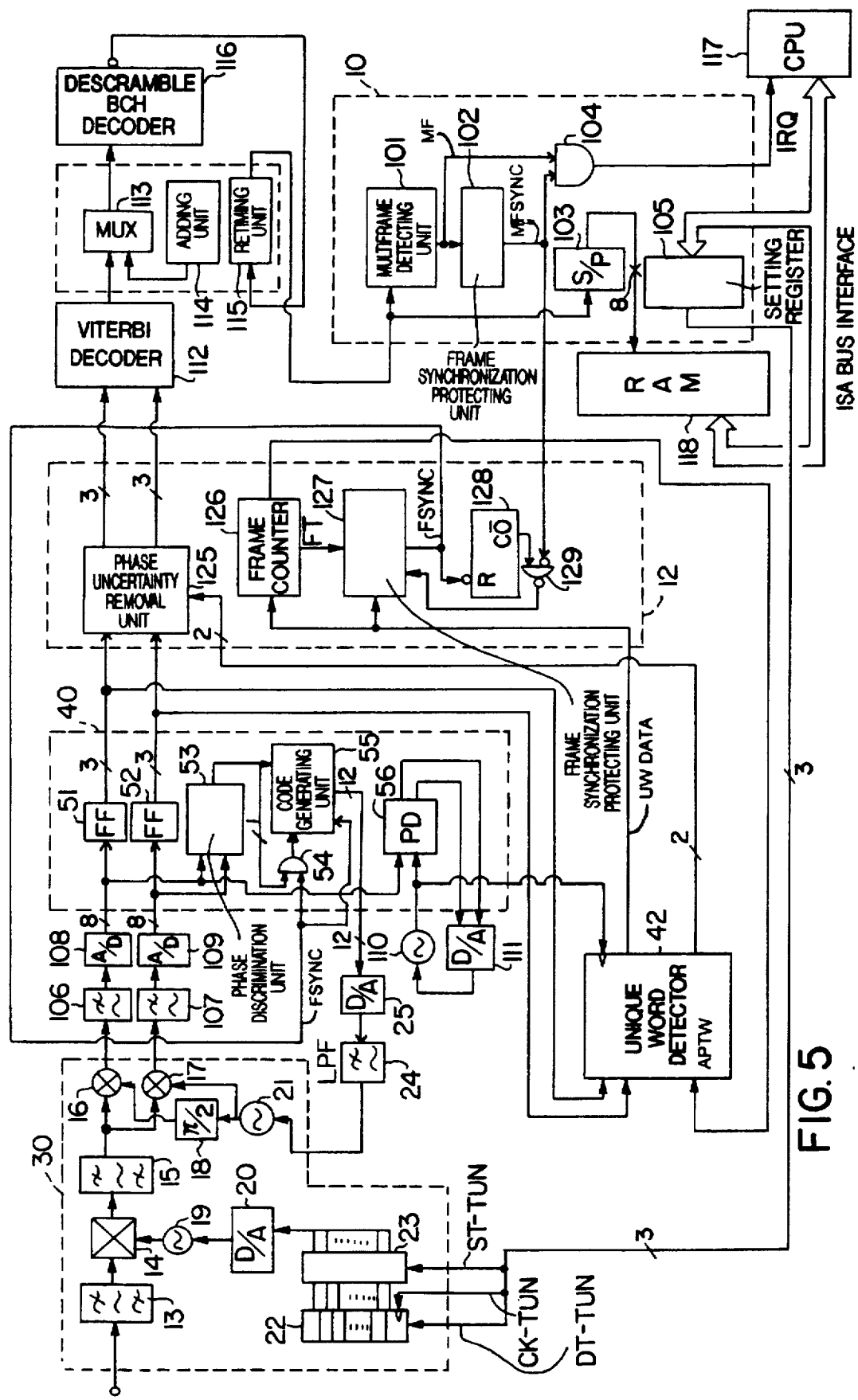
FIG. 5 illustrates a structure of an automatic frequency control circuit through detection of a frame pattern according to an embodiment of the present invention.

FIG. 5 illustrates a preferred embodiment of the present invention. As illustrated, phase detecting unit 30 includes BPFs (Band-Pass Filters) 13 and 15; mixer 14; multipliers 16 and 17; π/2 phase shifter 18; VCOs 19 and 21; D/A converter 20; shift register 22; and latch 23.

Orthogonal phase detector 40 includes flip-flops 51 and 52; phase discrimination unit 53; logic circuit 54; code generating unit 55; and PD (Phase Detector) 56. The reference number 42 denotes a unique word detector.

Receiving condition discriminating unit 12 includes phase uncertainty removal unit 125; frame counter 126; frame synchronization protecting unit 127; counter 128 and logic circuit 129. Upper frame detecting unit 10 includes multiframe detecting unit 101; frame synchronization protecting unit 102; logic circuit 104; S/P converting unit 103 and setting register 105. Reference numerals 106 and 107 denote LPFs (low-pass filters); 108 and 109 denote A/D converters; 24 denotes a LPF (low-pass filter); 25 and 111 denote D/A converters; 110 denotes an oscillator OSC; 112 denotes a viterbi decoder; 113 denotes a MUX (multiplexor); 114 denotes a BS-UWD adding unit (a part for adding unique word data, e.g. a descramble BCH decoder); 115 denotes a retiming unit; 116 denotes a descramble BCH decoder; 117 denotes a CPU; and 118 denotes a RAM.

Phase detecting unit 30 detects the phase of a modulated signal of the RF (radio frequency) band with a carrier from VCO 21 to extract the phase elements Ich and Qch. The phase elements Ich and Qch obtained by phase detecting unit 30 are removed from the RF signal through LPFs 106 and 107.

Next, A/D converters 108 and 109 convert the analog 1-bit signals of the input phase elements Ich and Qch into quantized digital signals. The quantized digital signals are then input to orthogonal phase detector 40 wherein the upper three bits among the eight bit quantized digital signal are discriminated for lead or delay in phase.

Orthogonal phase detector 40 outputs a frequency code to D/A converter 25 on the basis of the information showing lead or delay of the obtained phase, as explained above, to control VCO 21. The center frequency of the carrier produced by VCO 21 then approaches the frequency of the received modulated signal. D/A converter 25 converts the frequency code to an analog signal and outputs the analog signal to LPF 24. LPF 24 removes the radio frequency elements and then outputs the signal to phase detecting unit 30.

PD 56 is a phase detector in orthogonal phase detector 40 which reproduces a system clock synchronized with the received modulated signal by comparing the phases of the digital signal Ich (which is an output of A/D converter 108) and an output of the oscillator OSC 110. PD 56 then outputs frequency information based on the comparison result to D/A converter 111. D/A converter 111 converts the frequency information from PD 56 into a digital element to control the phase of OSC 110.

Flip-flops 51 and 52 only output the upper three bits of Ich and Qch received from A/D converters 108 and 109. Unique word detector 42 receives the upper one bit of the quantized three bits of Ich and Qch from the flip-flops 51 and 52 (in orthogonal phase detector 40) and detects matching with a predetermined pattern of a unique word. Unique word detector 42 then outputs a pulse, i.e. UW DATA, to receiving condition discriminating unit 12 when matching is detected.

Receiving condition discriminating unit 12 receives the pulse from unique word detector 42 and outputs a timing signal indicating the position of the unique word after the next frame to the APTW terminal of the unique word data detector 42. In addition, the unique word detector 42 outputs 2-bit data indicating the phase pattern of the detected unique word pattern to the phase uncertainty removal unit 125. The phase uncertainty removal unit 125 inverts, on the basis of the 2-bit data indicating the phase of the unique word pattern from the unique word data detector 42, the phases of the Ich and Qch data to remove the phase uncertainty, then outputs data from which the phase uncertainty has been removed to viterbi decoder 112.

Viterbi decoder 112 corrects errors of the Ich and Qch data received from the phase uncertainty removal unit 125. MUX 113 changes the unique word in the data from the viterbi decoder 112 fitted on the BS-UWD adding unit 114 into a unique word which can be processed by a descramble BCH decoder 116 provided in a subsequent stage.

Descramble BCH decoder 116 descrambles the signal indicating which unique word has been changed in MUX 113 and outputs the signal to retiming unit 115. Retiming unit 115 reforms the input signal with the system clock and outputs the reformed signal to a multiframe detecting unit 101 of upper frame detecting unit 10. Upon detection that a pattern of the multiframe identification bits (which are in units of several frames and output from the retiming unit 115) is matched with a predetermined pattern, multiframe detecting unit 101 outputs an MF (multiframe) timing signal.

Frame synchronization protecting unit 102 effectuates the rear end protecting function to count up the number of MF timing signals and outputs, under the assumption that synchronization of the receiving signal is established, a synchronization setup signal MFSYNC to the logic circuits 104 and 129 when a predetermined number of timing signals are input. Frame synchronization protecting unit 102 provides the functions not only for rear end protection but also for front end protection. Frame synchronization protecting unit 102 also supervises, after synchronization is established through the rear end protecting process, whether the identification pattern of the multiframe is detected continuously or not. When the predetermined number of times of detection is not confirmed, frame synchronization protecting unit 102 does not output the MFSYNC under an assumption that synchronization is not yet established.

Setting register 105 stores the information applied from CPU 117 for designating the channel signal to be fetched among the signals received. That is, the stored information may be the tuner frequency setting signal, the frequency data for designating a channel, the data clock and timing for outputting the frequency data.

Setting register 105 outputs the frequency data DT-TUN and data clock CK-TUN among the tuner frequency setting signals to the shift register 22 of the phase detecting unit 30. Setting register 105 also outputs the signal ST-TUN indicating the timing for outputting the remaining frequency data to latch 23. Shift register 22 sequentially stores DT-TUN with the data clock from CK-TUN to output in parallel the stored data to latch 23. Latch 23 latches the parallel data from the shift register 22 and outputs the latched parallel data with the signal indicated by the timing from ST-TUN.

D/A converter 20 converts the data from the latch 23 into an analog signal to control VCO 19. Mixer 14 mixes the signal of the predetermined band extracted by BPF 13 of the phase detecting unit 30 with the carrier signal from VCO 19 to obtain the necessary channel signal among the received signal. Mixer 14 then outputs a signal indicating a frequency difference between the receiving signal and the carrier of VCO 19 to BPF 15.

BPF 15 allows only the predetermined frequency band of the output signal from the mixer 14 to pass to multipliers 16 and 17. Multiplier 16 multiplies the input signal with the carrier for which the phase of the carrier from VCO 21 is shifted by π/2 with π/2 phase shifter 18 to output the signal of Ich (phase element). Multiplier 17 multiplies the input signal with the carrier from VCO 21 and outputs the signal of Qch (phase element). VCO 21 shifts the center frequency of the carrier depending on a voltage which is based on the frequency code obtained through D/A converter 25 and LPF 24. The 12-bit frequency code is then output to orthogonal phase detector 40.

Next, a detailed operation of phase discrimination unit 53, logic circuit 54 and code generating unit 55 of orthogonal phase detector 40 will be explained with reference to FIG. 5 and FIG. 8.

Phase discrimination unit 53 discriminates polarity using the upper one bit (indicating signal polarity) among eight bits of the quantized Ich from the A/D converter 108 and an upper one bit (indicating signal polarity) among eight bits of the quantized Qch from the A/D converter 109. Phase discrimination unit 53 generates a phase lead and delay control signal by comparing absolute values, namely the amplitudes of the lower seven bits of Ich from A/D converter 108 and the lower seven bits of Qch from A/D converter 109. Phase discrimination unit 53 outputs a control signal "0" for a lead phase and a control signal "1" for a delay phase.

Logic circuit 54 determines an output depending on the level "1" or "0" of the control signal from the phase discrimination unit 53 when the synchronization setup flag FSYNC is input from frame synchronization protecting unit 127. Logic circuit 54 outputs "0" without relation to the output of phase discrimination unit 53 if the synchronization setup flag is not input from frame synchronization protecting unit 127.

Code generating unit 55 outputs a 12-bit frequency code to D/A converter 25 depending upon the output of logic circuit 54, synchronization setup flag FSYNC from the frame synchronization protecting unit 127, and the control signal from the phase discrimination unit 53.

Figure 8:
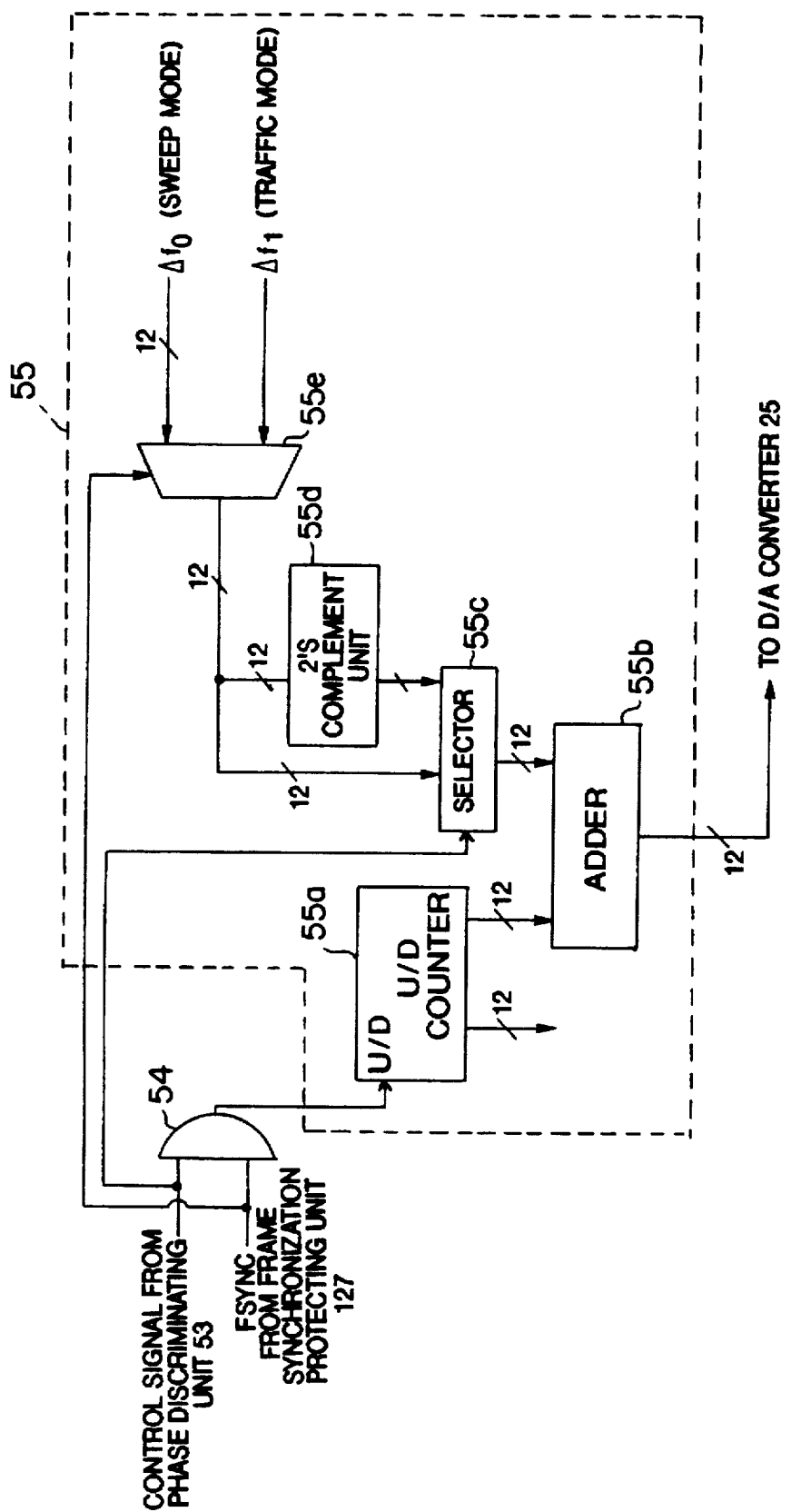
FIG. 8 illustrates a detailed structure of a code generating unit of FIG. 5 according to an embodiment of the present invention.

A detailed structure of code generating unit 55 is illustrated in FIG. 8. A control signal is input from phase discrimination unit 53 to one input terminal of logic circuit 54 while a synchronization setup flag FSYNC from frame synchronization protecting unit 127 is input to the other input terminal.

Logic circuit 54 outputs a value "1" to U/D counter 55a when the control signal is "1" and the synchronization setup flag is "1", and outputs a value "0" in other cases. U/D counter 55a sequentially counts down a 24-bit count value to output only the upper 12 bits to adder 55b when the output of the logic circuit 54 is "1" and sequentially counts up the 24-bit count value to output only the upper 12 bits to adder 55b when the output of the logic circuit 54 is "0". Selector 55e selects the 12-bit fixed value information $\Delta f_1$ (appearing when the synchronization is set up) or the 12-bit fixed value information $\Delta f_0$ (appearing when the synchronization is not set up, i.e. during sweep mode) depending on whether the synchronization setup flag FSYNC is a "1" or a "0".

However, the 12-bit fixed value information $\Delta f_1$ appearing when the synchronization is set up is smaller than the 12-bit fixed value information appearing when the synchronization is not set up. Selector 55e selects the fixed value information $\Delta f_1$ when the synchronization setup flag is 1 and selects the fixed value information $\Delta f_0$ when the synchronization setup flag is 0.

2's complement unit 55d performs the processing for obtaining a 2's complement to the 12-bit information from the selector 55e and subsequently outputs the 2's complement.

A selector 55c selects the 12-bit information from selector 55e and the 12-bit information via 2's complement unit 55d depending on a control signal from the phase discrimination unit 53. The selector 55c selects the 12-bit information from the selector 55e without processing through the 2's complement unit 55d when the control signal is "1", and selects the 12-bit information via the 2's complement unit 55d when the control signal is "0". Adder 55b outputs a value obtained by addition of the counter value of the upper 12 bits from the U/D counter 55a and the 12-bit information from the selector 55c to the D/A converter 25. Thus, code generating unit 55 moves data indicating a center frequency up or down in response to a detected lead or delay in phase, and in response to a received frame synchronization signal FSYNC.

Figure 6:
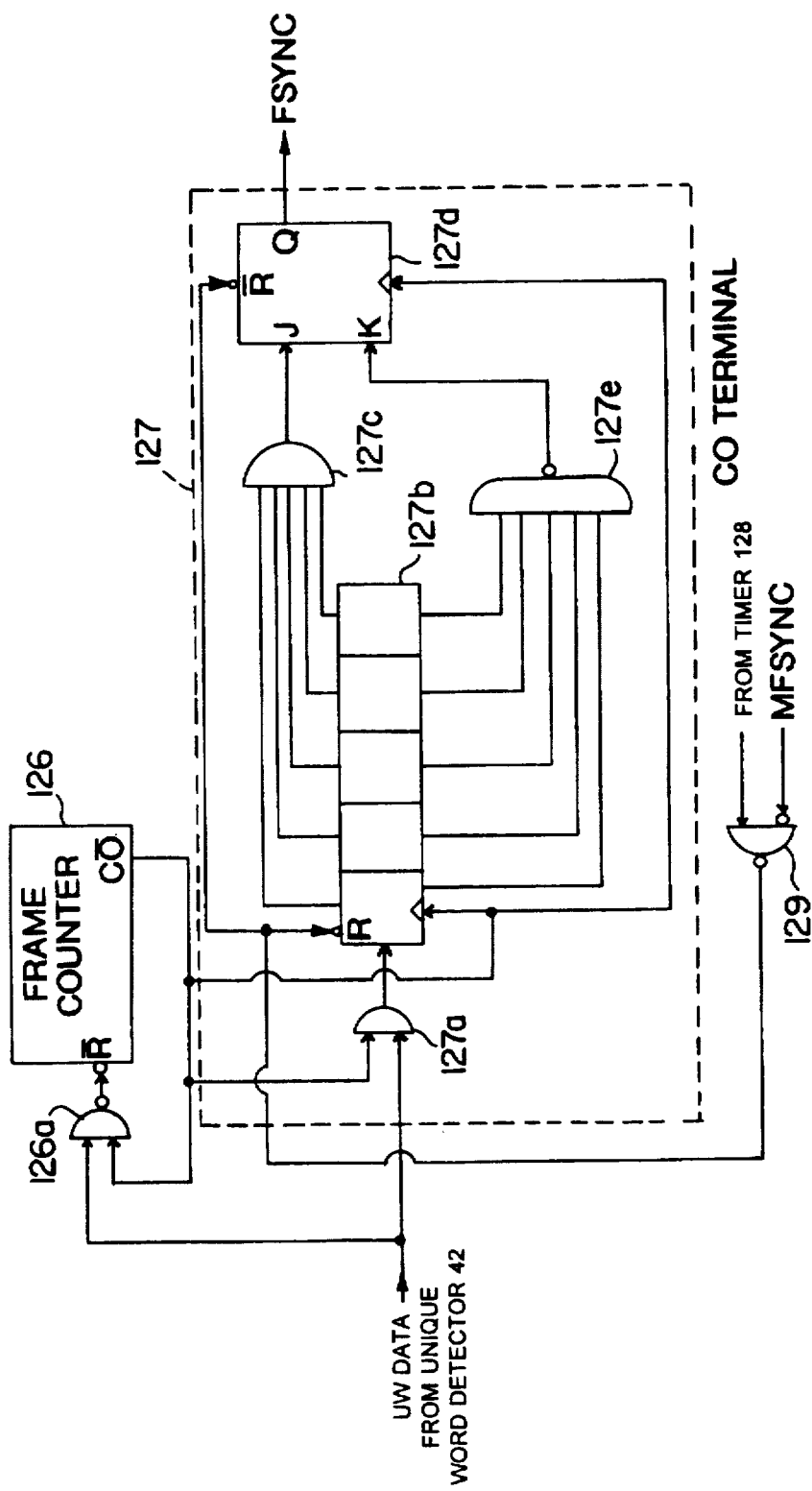
FIG. 6 illustrates a detailed structure of a receiving condition discriminating unit of FIG. 5 according to an embodiment of the present invention.

FIG. 6 illustrates a detailed structure of frame counter 126, frame synchronization protecting unit 127, timer circuit 128 and logic circuit 129 in receiving condition discriminating unit 12. As illustrated, logic circuit 126a outputs a value "0" upon receiving an input of detected pulses from unique word detector 42 or a count-up pulse of frame counter 126.

Frame counter 126 is reset by receiving a value "0" output from logic circuit 126a and thereafter starts counting. When frame counter 126 counts up to a predetermined value, it outputs a count-up pulse. Logic circuit 127a of frame synchronization protecting unit 127 outputs a logical product of a detected pulse from unique word detector 42 and a count-up pulse from frame counter 126 to shift register 127b.

Shift register 127b receives an output from logic circuit 127a by shifting the output bit by bit to the right side for every count-up pulse from frame counter 126. The shift register 127b is formed as a 5-bit shift register. The shift register 127b outputs in parallel the 5-bit stored data to the logic circuit 127c and logic circuit 127e for every received count-up pulse of frame counter 126.

Logic circuit 127c outputs a value "1" when the 5-bit parallel outputs from shift register 127b are all "1" and outputs a value "0" in other cases. Logic circuit 127e outputs a value "1" when the 5-bit parallel outputs from shift register 127b are all "0" and also outputs a value "0" in all other cases. JK flip-flop 127d outputs a value "1" FSYNC continuously when a value "1" is received from logic circuit 127c. JK flip-flop 127d continuously outputs a value "0" when a value "1" is received from logic circuit 127e. In other words, shift register 127b judges that synchronization is established when the stored five bits are all a value "1" and changes the output from JK flip-flop 127d from "0" to "1". Moreover, the shift register 127b judges that synchronization is cancelled when the five bits in the register are all "0", and changes the output of JK flip-flop 127d to "0".

Logic circuit 127c does not judge that synchronization is set up until the rear end protecting function for detection of the unique word is detected for the predetermined number of times. Logic circuit 127e does not immediately judge that synchronization is cancelled even when the unique word cannot be detected after synchronization is set by detection of the unique word but judges that synchronization is cancelled when the unique word is detected for the predetermined number of times.

Timer circuit 128 of FIG. 5 is reset by the synchronization setup flag FSYNC from frame synchronization protecting unit 127 and then starts counting. After counting up to a predetermined number of times, timer circuit 128 outputs a value "1" to one terminal of logic circuit 129 as the count up pulse. Next, logic circuit 129 outputs the reset signal to shift register 127b of synchronization protecting unit 127 and JK flip-flop 127d when the multiframe synchronization setup flag 0 MFSYNC is received by the other terminal of frame synchronization protecting unit 102 of the upper frame detecting unit 10.

Detailed operations of multiframe detecting unit 101, frame synchronization protecting unit 102 and logic circuit 104 of the upper frame detecting unit 10 will be explained with reference to FIG. 7.

An output of the retiming unit 115 shown in FIG. 5 is received by the multiframe detector 101a of multiframe detecting unit 101.

Figure 9:
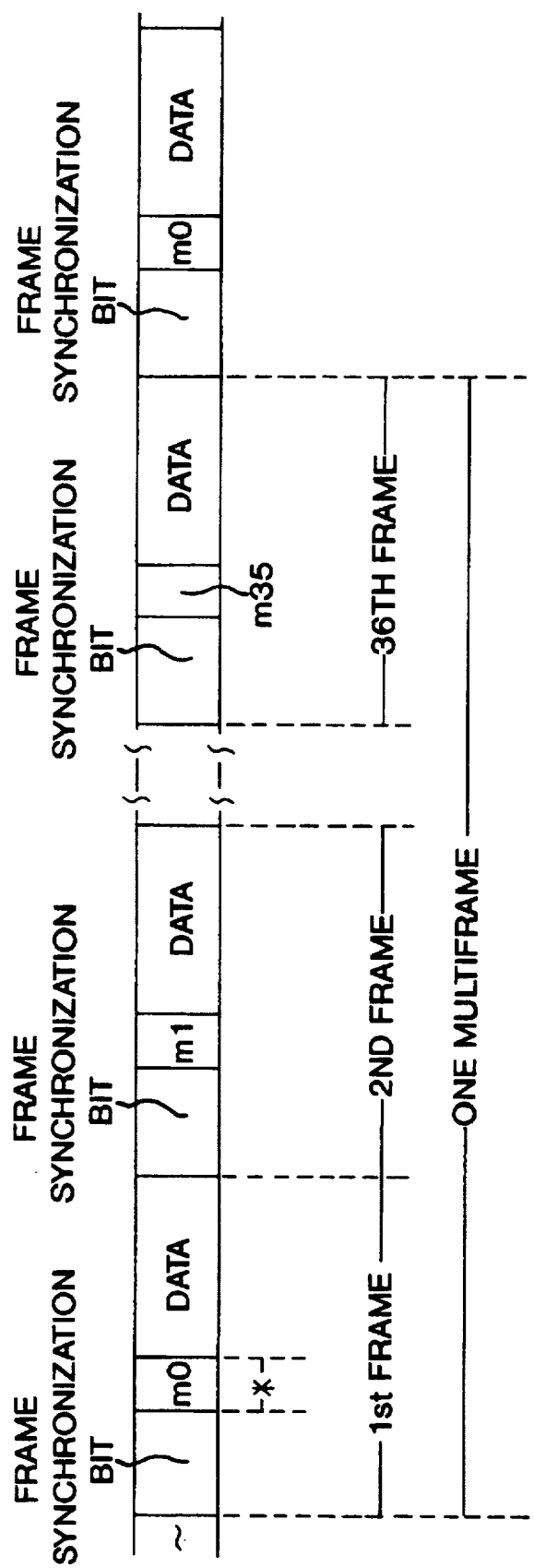
FIG. 9 illustrates a frame format of a receiving signal according to an embodiment of the present invention.

The receiving signal in the present invention has a frame format as shown in FIG. 9 and this frame format is explained below. In the receiving signal of the present invention, one multiframe is formed of 36 frames and frame synchronization bits are placed as the leading bit of each frame for the purpose of identification a frame unit. The frame synchronization bits form a synchronization code for setting up synchronization and is called a unique word. The frame synchronization code is formed, for example, of 36 bits.

As illustrated in FIG. 9, a plurality of multiframe identification bits ($m_0$ to $m_{35}$) are respectively placed after each frame synchronization bit. The 36-bit multiframe identification bits ($m_0$ to $m_{35}$) are matched with a predetermined synchronization pattern of, for example, 36 bits in order to set up the synchronization of the multiframe as a whole. The present invention thereby realizes data reception in the multimedia multiple addressing system using such a receiving signal.

Figure 7:
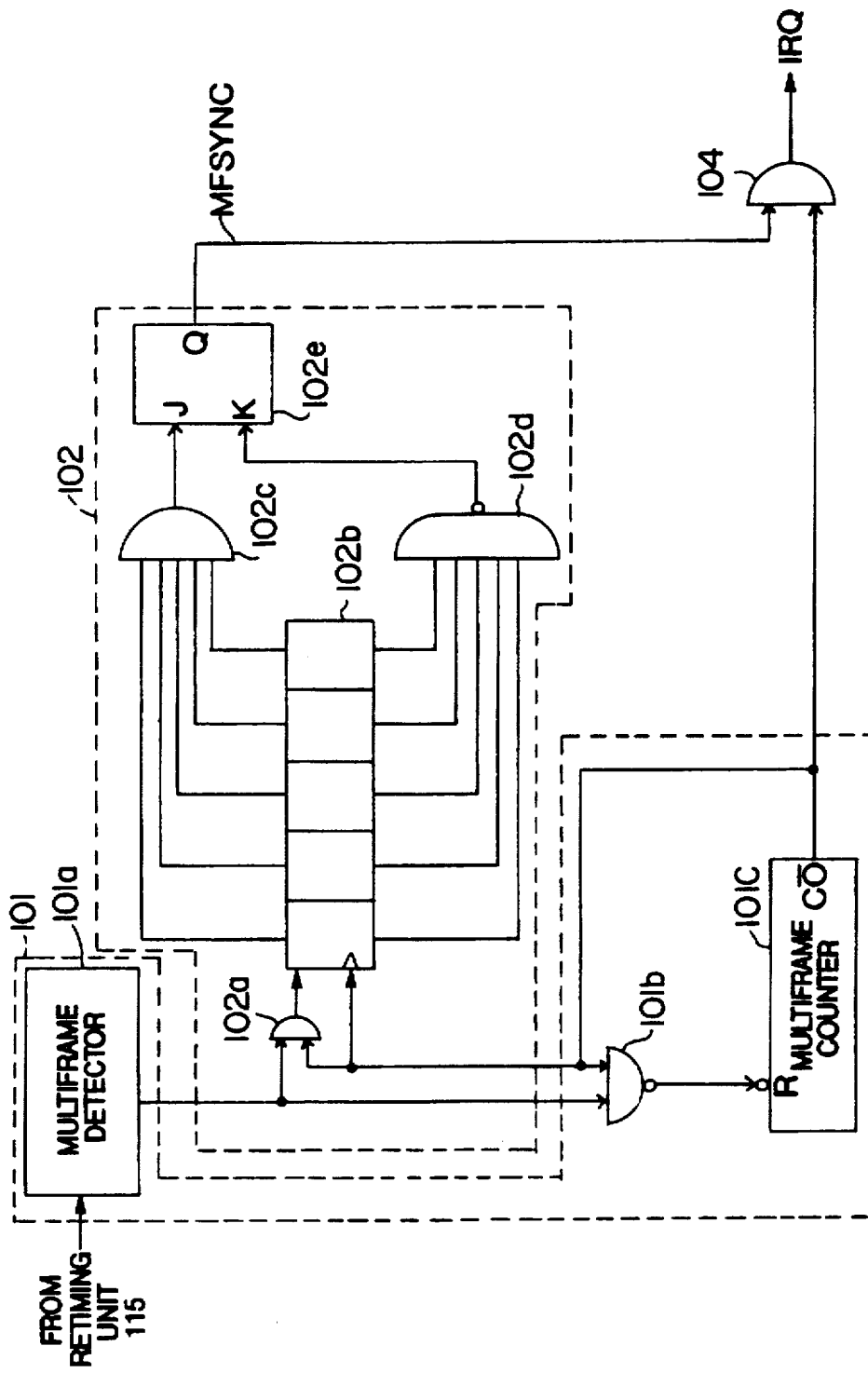
FIG. 7 illustrates a detailed structure of an upper frame detecting unit of FIG. 5 according to an embodiment of the present invention.

Multiframe detector 101a of FIG. 7 outputs a value "1" when the multiframe identification bits in the multiframe are matched with the predetermined pattern and outputs a value "0" when such multiframe identification bits are not matched with the predetermined pattern. The output of multiframe detector 101a is received by logic circuit 102a of frame synchronization protecting unit 102 and logic circuit 101b of multiframe detecting unit 101.

Logic circuit 102a obtains a logical product between an output of multiframe detector 101a and a count-up output of multiframe counter 101c. Logic circuit 102a outputs a value "1" to shift register 102b when an output of multiframe detector 101a is a "1" and a count-up output of multiframe counter 101c is a "1", and outputs a value "0" to shift register 102b in other cases.

Shift register 102b outputs data to logic circuit 102c by sequentially shifting the data bit by bit. Shift register 102b outputs the data to logic circuit 102d in 5-bit parallel form for every output "1" (count up) of multiframe counter 101c. Logic circuit 102c outputs flag "1" in order to effectuate the function for rear end protection of the multiframe detection by judging that synchronization is set up when the five bits stored in the shift register 102b are all "1", namely when the multiframe pattern is detected for five successive times. Logic circuit 102c outputs the flag "0" in other cases based on the assumption that synchronization is not set up.

On the condition that the multiframe pattern is not detected continuously after synchronization is set up by detection of the multiframe pattern, logic circuit 102d outputs the pulse "1" when the five bits stored in the shift register 102d are all "0". This effectuates the cancellation of the establishment of synchronization on the judgement that synchronization is already cancelled. Logic circuit 102d outputs pulse "0" in other cases on the judgement that synchronization is not cancelled.

JK flip-flop 102e outputs a value "0" when the pulse "1" from logic circuit 102d is received on the judgement that synchronization of the multiframe is cancelled. Logic circuit 104 outputs an interrupt signal IRQ to CPU 117 when both pulse "1" (indicating establishment of synchronization from the synchronization protecting unit 102) and a pulse indicating count-up of the multiframe counter 101c in multiframe detecting unit 101 are output.

The present invention detects a change of phase if phase is changed between the data of the unique word and the next unique word in the frame data within the receiving apparatus of the satellite multiple addressing multimedia system. This enables control to cause the frequency of a VCO to quickly and sufficiently follow the received carrier frequency.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An automatic frequency controller which synchronizes a received carrier signal with a simulated carrier signal comprising:

means for receiving a carrier signal having a center frequency, wherein the received carrier signal has a first synchronous code pattern inserted into a plurality of frame periods and a second synchronous code pattern inserted into a plurality of multiframe periods;

means for detecting the phase of the received carrier signal by sweeping the center frequency of a simulated carrier signal and mixing the simulated carrier signal with the received carrier signal;

means for detecting frame synchronization from the first synchronous code patterns;

means for detecting multiframe synchronization from the second synchronous code pattern; and means for reducing sweep of the center frequency of said simulated carrier signal when frame synchronization is detected and fixing the center frequency of said simulated carrier signal when multiframe synchronization is detected.

2. The automatic frequency controller according to claim 1, further comprising:

a code generating unit which selects a first frequency variation value upon detection of frame synchronization and which selects a second frequency variation value upon failing to detect frame synchronization.

3. The automatic frequency controller according to claim 1, further comprising:

a voltage controlled oscillator which selectively varies the sweep of said simulated carrier signal at a first frequency in response to a first frequency variation value and which varies the sweep of said simulated carrier signal at a second frequency in response to a second frequency variation value.

4. The automatic frequency controller according to claim 1, further comprising means for fetching a channel signal from said received carrier signal.

5. The automatic frequency controller according to claim 1, further comprising:

means for removing phase uncertainty from said received carrier signal before detection of multiframe synchronization from the second synchronous code pattern.

6. The automatic frequency controller according to claim 1, further comprising:

means for retiming said received carrier signal to align with a system clock before detection of multiframe synchronization from the second synchronous code pattern.

7. An automatic frequency control circuit comprising:

a receiving unit for receiving a phase-modulated signal in which a synchronous code pattern is inserted into each of a plurality of predetermined frame periods and a plurality of synchronization identification bits are inserted into each of a plurality of multiframe periods;

a phase detecting unit for detecting the phase of the phase-modulated signal with a sweeping regenerated carrier signal;

a synchronous code detecting unit for detecting whether the synchronous code pattern is matched with one of a plurality of predetermined synchronous code patterns;

an upper frame detecting unit for detecting whether the plurality of synchronization identification bits are matched with a predetermined bit pattern; and a sweep control unit for fixing sweep of said regenerated carrier signal when matching is detected by said upper frame detecting unit and said synchronous code detecting unit.

8. The automatic frequency control circuit according to claim 7, further comprising:

a code generating unit which selects a first frequency variation value upon matching of the synchronous code pattern with said one of the plurality of predetermined synchronous code patterns and which selects a second frequency variation value upon failing to match the synchronous code pattern with said one of the plurality of predetermined synchronous code patterns.

9. The automatic frequency control circuit according to claim 7, further comprising:

a voltage controlled oscillator which selectively varies the sweep of said sweeping regenerated carrier signal at a first frequency in response to a first frequency variation value and which varies the sweep of said sweeping regenerated carrier signal at a second frequency in response to a second frequency variation value.

10. The automatic frequency control circuit according to claim 7, further comprising:

a central processing unit which outputs frequency data corresponding to a selected channel frequency;

a D/A converter which converts the frequency data from said central processing unit into a tuning analog signal;

a second voltage controlled oscillator which outputs a tuning carrier signal in response to the tuning analog signal from said D/A converter; and a mixer which mixes the tuning carrier signal with the phase-modulated signal to thereby output the selected channel frequency.

11. The automatic frequency control circuit according to claim 7, further comprising:

a phase uncertainty removal unit for removing phase uncertainty from said received signal before matching of the plurality of synchronization identification bits with the predetermined bit pattern by said upper frame detecting unit.

12. The automatic frequency control circuit according to claim 7, further comprising:

a retiming unit for retiming said received signal to align with a system clock before matching of the plurality of synchronization identification bits with the predetermined bit pattern by said upper frame detecting unit.

13. An automatic frequency control circuit comprising:

receiving means for receiving a phase-modulated signal in which a synchronous code pattern is inserted into each of a plurality of predetermined frame periods and a plurality of synchronization identification bits are inserted into each of a plurality of multiframe periods;

phase detecting means for detecting the phase of the phase-modulated signal with a sweeping regenerated carrier signal;

synchronous code detecting means for detecting whether the synchronous code pattern is matched with one of a plurality of predetermined synchronous code patterns;

upper frame detecting means for detecting whether the plurality of synchronization identification bits are matched with a predetermined bit pattern; and sweep control means for fixing sweep of said regenerated carrier signal when matching is detected by said upper frame detecting means and said synchronous code detecting means.

14. The automatic frequency control circuit according to claim 13, further comprising:

a code generating unit which selects a first frequency variation value upon matching of the synchronous code pattern with said one of the plurality of predetermined synchronous code patterns and which selects a second frequency variation value upon failing to match the synchronous code pattern with said one of the plurality of predetermined synchronous code patterns.

15. The automatic frequency control circuit according to claim 13, further comprising:

voltage control means for selectively varying the sweep of said sweeping regenerated carrier signal at a first frequency in response to a first frequency variation value and varying the sweep of said sweeping regenerated carrier signal at a second frequency in response to a second frequency variation value.

16. The automatic frequency control circuit according to claim 13, further comprising:

central processing means for outputting frequency data corresponding to a selected channel frequency;

D/A converter means for converting the frequency data from said central processing means into a tuning analog signal;

second voltage control means for outputting a tuning carrier signal in response to the tuning analog signal from said D/A converter means; and mixing means for mixing the tuning carrier signal with the phase-modulated signal to thereby output the selected channel frequency.

17. The automatic frequency control circuit according to claim 13, further comprising:

phase uncertainty removal means for removing phase uncertainty from said received signal before matching of the plurality of synchronization identification bits with the predetermined bit pattern by said upper frame detecting unit.

18. The automatic frequency control circuit according to claim 13, further comprising:

retiming means for retiming said received signal to align with a system clock before matching of the plurality of synchronization identification bits with the predetermined bit pattern by said upper frame detecting means.

19. An Automatic frequency control circuit which synchronizes a center frequency of a simulated carrier signal with a center frequency of a phase-modulated signal, comprising:

a phase detecting unit which extracts phase elements Ich and Qch from a phase-modulated signal through mixing with a sweeping simulated carrier signal;

an orthogonal phase detector which generates a phase control signal indicating sweep rate of said simulated carrier signal in response to said phase elements Ich and Qch and a received frame synchronization signal;

a unique word detector which repeatedly compares the phase elements Ich and Qch with a predetermined pattern of a unique word and outputs a pulse upon detecting that a match has occurred;

a frame synchronization protecting unit which determines that a predetermined number of frames are in synchronization in response to pulses from said unique word detector and outputs the frame synchronization signal in response thereto; and an upper frame detecting unit which determines that a predetermined number of multiframes are in synchronization in response to the phase elements Ich and Qch;

wherein said orthogonal phase detecting unit reduces the sweep rate of a center frequency of said simulated carrier signal when frame synchronization is detected and fixes the sweep of the center frequency of said simulated carrier signal when multiframe synchronization is detected.

20. The automatic frequency control circuit according to claim 19, further comprising:

a code generating unit which selects a first frequency variation value upon receiving a pulse from said unique word detecting unit indicating that a match has occurred and which selects a second frequency variation value upon receiving a pulse from said unique word detecting unit indicating that a match has not occurred; and a voltage controlled oscillator which selectively varies the sweep of said simulated carrier at a first frequency in response to said first frequency variation value and which varies the sweep of said simulated carrier at a second frequency in response to said second frequency variation value.

* * * * *